United States Patent
Baik et al.

(10) Patent No.: US 7,542,296 B1
(45) Date of Patent: Jun. 2, 2009

(54) KEYING IMPLEMENTATION FOR SWAPPING PAIRED DEVICES

(75) Inventors: David J. Baik, Sunnyvale, CA (US); George Feltovich, San Jose, CA (US); Brad Reger, Dublin, CA (US); David Willheim, Los Gatos, CA (US); Harold Miyamura, San Jose, CA (US)

(73) Assignee: Network Appliance, Inc., Sunnyvale, CA (US)

(*) Notice: Subject to any disclaimer, the term of this patent is extended or adjusted under 35 U.S.C. 154(b) by 300 days.

(21) Appl. No.: 11/280,150

(22) Filed: Nov. 16, 2005

(51) Int. Cl.
*H05K 5/00* (2006.01)
*H05K 7/00* (2006.01)

(52) U.S. Cl. ............ 361/730; 361/679.01; 361/679.02; 361/729

(58) Field of Classification Search ......... 361/724–741, 361/784–788, 679, 679.01, 679.02; 312/223.1, 312/223.2
See application file for complete search history.

(56) References Cited

U.S. PATENT DOCUMENTS

| | | | |
|---|---|---|---|
| 3,594,689 A * | 7/1971 | Hopt et al. ............ 439/292 |
| 4,401,351 A * | 8/1983 | Record ................. 439/61 |
| 4,718,858 A * | 1/1988 | Godfrey et al. ......... 439/296 |
| 5,469,331 A * | 11/1995 | Conway et al. ......... 361/716 |
| 5,677,830 A * | 10/1997 | Nogas et al. .......... 361/790 |
| 5,949,653 A * | 9/1999 | Weng ................. 361/735 |
| 6,246,580 B1 * | 6/2001 | Weng ................. 361/695 |
| 6,501,659 B1 * | 12/2002 | Bodensteiner et al. ... 361/732 |
| 6,567,275 B1 * | 5/2003 | Hou et al. ............. 361/807 |
| 6,762,934 B2 * | 7/2004 | Kitchen et al. ......... 361/685 |
| 6,781,844 B2 * | 8/2004 | Clidaras et al. ........ 361/735 |
| 6,795,318 B2 * | 9/2004 | Haas et al. ........... 361/729 |
| 7,272,012 B2 * | 9/2007 | Salinas et al. ......... 361/727 |
| 7,414,856 B2 * | 8/2008 | Sandgren et al. ....... 361/756 |
| 2002/0111078 A1 * | 8/2002 | Sevier et al. .......... 439/680 |
| 2006/0002094 A1 * | 1/2006 | Cunha ................ 361/747 |
| 2006/0232917 A1 * | 10/2006 | Wu et al. ............. 361/681 |

* cited by examiner

*Primary Examiner*—Anatoly Vortman
*Assistant Examiner*—Quinn Hunter
(74) *Attorney, Agent, or Firm*—Suiter Swantz pc llo (57) ABSTRACT

A system of keying implementation for swapping paired devices is provided. The system includes a controller module having a first keying member, a power supply unit having a second keying member, and a chassis having a plurality of receiving slots for receiving the controller module and the power supply unit. When the controller module and the power supply unit are a matched pair and when the controller module and the power supply unit are fully inserted, next to each other, into the plurality of receiving slots, the first keying member and the second keying member do not interfere with each other so that the power supply unit may supply power to the controller module.

7 Claims, 11 Drawing Sheets

KEYING IMPLEMENTATION FOR SWAPPING PAIRED DEVICES

FIELD OF THE INVENTION

This invention relates generally to controller modules, and particularly to a method and system of keying implementation for swapping paired devices.

BACKGROUND OF THE INVENTION

Matched pairs of controller modules and power supply units (PSUs) are often installed in the same chassis. Some examples of controller modules may include RAID (Redundant Array of Independent Disks) controllers, JBOD (Just a Bunch of Disks—no RAID functionality) controllers, SBOD (Switched Bunch of Disks—connected via some form of electronic "switch") controllers in disk drive storage enclosures, and the like. There are many different matched controller/PSU pairs (or pairs): a high-power pair, a medium-power pair, a low power pair, and the like. A high-power matched pair includes a controller which needs a high power supply (high-power controller) and a PSU which is capable of supplying the high power to the controller (high-power PSU). A medium-power matched pair includes a controller which needs a medium power supply (medium-power controller) and a PSU which is capable of supplying the medium power to the controller (medium-power PSU). A low-power matched pair includes a controller which needs a low power supply (low-power controller) and a PSU which is capable of supplying the low power to the controller (low-power PSU). If one part of the matched pair fails, the replacement part has to match the original pair. For example, if a PSU of a high-power pair fails, the replacement PSU has also to be a high-power PSU; otherwise, a mismatched pair may happen. A mismatched pair happens when a power level of a controller fails to match a power level of a PSU. For example, a high-power controller and a low-power PSU are a mismatched pair. A mismatched pair may cause circuit overhead and/or insufficient power required to run the controller.

Thus, it would be desirable to provide a method and system for preventing a mismatched controller/PSU pair from being installed in a chassis.

SUMMARY OF THE INVENTION

In an exemplary aspect of the present invention, a method of keying implementation for swapping paired devices is provided. A controller module including a first keying member is provided. A power supply unit including a second keying member is provided. When the first keying member matches the second keying member, the controller module and the power supply unit are fully inserted, next to each other, into receiving slots of a chassis so that the power supply unit may supply power to the controller module.

In an additional exemplary aspect of the present invention, a method of keying implementation for swapping paired devices is provided. At least one controller module and at least one power supply unit are provided. A chassis including receiving slots for receiving the at least one controller module and the at least one power supply unit is provided. A first keying member is installed on one of the at least one controller module. A second keying member is installed on one of the at least one power supply unit. When the one of the at least one controller module and the one of the at least one power supply unit are a matched pair, the one of the at least one controller module and the one of the at least one power supply unit may be fully inserted, next to each other, into the receiving slots so that the one of the at least one power supply unit may supply power to the one of the at least one controller module. When the one of the at least one controller module and the one of the at least one power supply unit are not a matched pair, the first keying member and the second keying member may prevent the one of the at least one controller module and the one of the at least one power supply unit from being fully inserted, next to each other, into the receiving slots.

In another exemplary aspect of the present invention, a system of keying implementation for swapping paired devices is provided. The system includes a controller module having a first keying member, a power supply unit having a second keying member, and a chassis having a plurality of receiving slots for receiving the controller module and the power supply unit. When the controller module and the power supply unit are a matched pair and when the controller module and the power supply unit are fully inserted, next to each other, into the plurality of receiving slots, the first keying member and the second keying member do not interfere with each other so that the power supply unit may supply power to the controller module.

In a further exemplary aspect of the present invention, a method of keying implementation for swapping paired devices is disclosed. A first controller module including a first plurality of keying members, a second controller module including a second plurality of keying members, a first power supply unit including a third plurality of keying members, and a second power supply unit including a fourth plurality of keying members are provided. A chassis including receiving slots for receiving the first controller module, the second controller module, the first power supply unit, and the second power supply unit are provided. When the first controller module and the first power supply unit are a matched pair, the first controller module and the first power supply unit are fully inserted, next to each other, into the receiving slots so that the first power supply unit may supply power to the first controller module.

In still a further exemplary aspect of the present invention, a method of keying implementation for swapping paired devices is disclosed. A first controller module including a first plurality of keying members and a second controller module including a second plurality of keying members are fully inserted, next to each other, into receiving slots of a chassis. The first controller module and the second controller module are of a same type, where the first plurality of keying members and the second plurality of keying members do not interfere with each other. A first power supply unit including a third plurality of keying members is fully inserted, next to the first controller module, into the receiving slots so that the first power supply unit may supply power to the first controller module. The first power supply unit and the first controller module is a matched pair, and the first plurality of keying members and the third plurality of keying members do not interfere with each other. A second power supply unit is fully inserted, next to the second controller module and the first power supply unit, into the receiving slots so that the second power supply unit may supply power to the second controller module. The second power supply unit is capable of providing a power level not lower than a power level required by the second controller module.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1A:
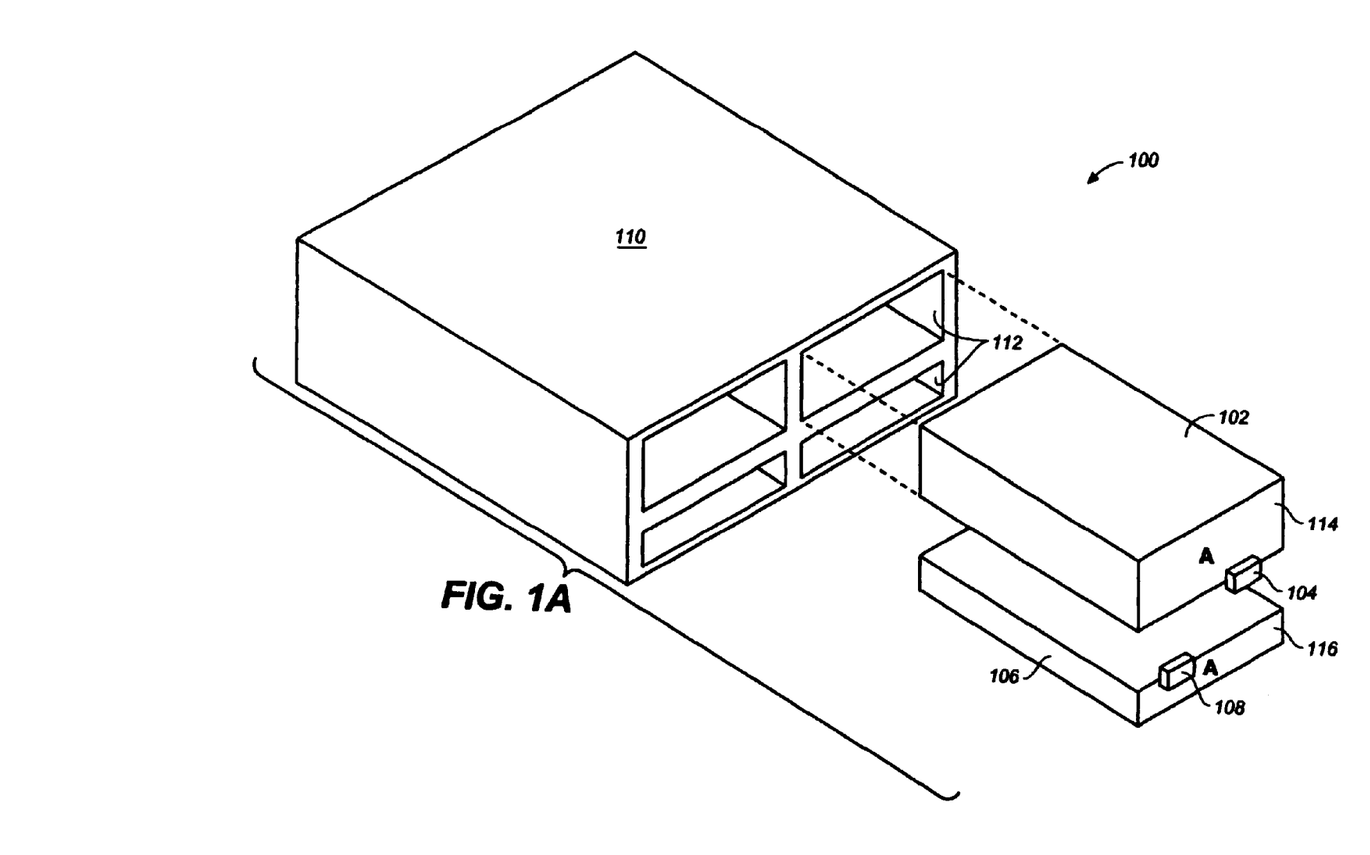
FIG. 1A is a schematic diagram illustrating a system of keying implementation for swapping paired devices in accordance with an exemplary embodiment of the present invention, where the system includes a type "A" matched controller/PSU pair.

Referring now to FIG. 1A, a system 100 of keying implementation for swapping paired devices in accordance with an exemplary embodiment of the present invention is shown. The system 100 includes a type "A" controller module 102 having a first keying member 104, a type "A" PSU 106 having a second keying member 108, and a chassis 110 having a plurality of receiving slots 112 for receiving the controller module 102 and the PSU 106. The controller module 102 may be a field replaceable unit (FRU). A FRU is a hardware component that can be replaced in the field upon failure or the like. Preferably, the first keying member 104 is a protrusion on a surface 114 of the controller module 102, and the second keying member 108 is a protrusion on a surface 116 of the PSU 106. Alternatively, the second keying member 108 may be positioned on a handle 120 (illustrated in FIGS. 1C and 1D) of the PSU 106, where the handle is closed (as illustrated in FIG. 1C) when the PSU 106 supplies power to the controller module 102. When the controller module 102 and the PSU 106 are a matched controller/PSU pair (or pair) such as a high-power pair, a medium-power pair, a low power pair, or the like, the first keying member 104 and the second keying member 108 do not interfere with each other (thus the keying members are matched) when the controller module 102 and the PSU 106 are fully inserted, next to each other, into the plurality of receiving slots 112 so that the PSU 106 may supply power to the controller module 102. In addition, when the controller module 102 and the PSU 106 are a matched pair, the matched pair may be color coded in the same color to help with easy identification.

Figure 1B:
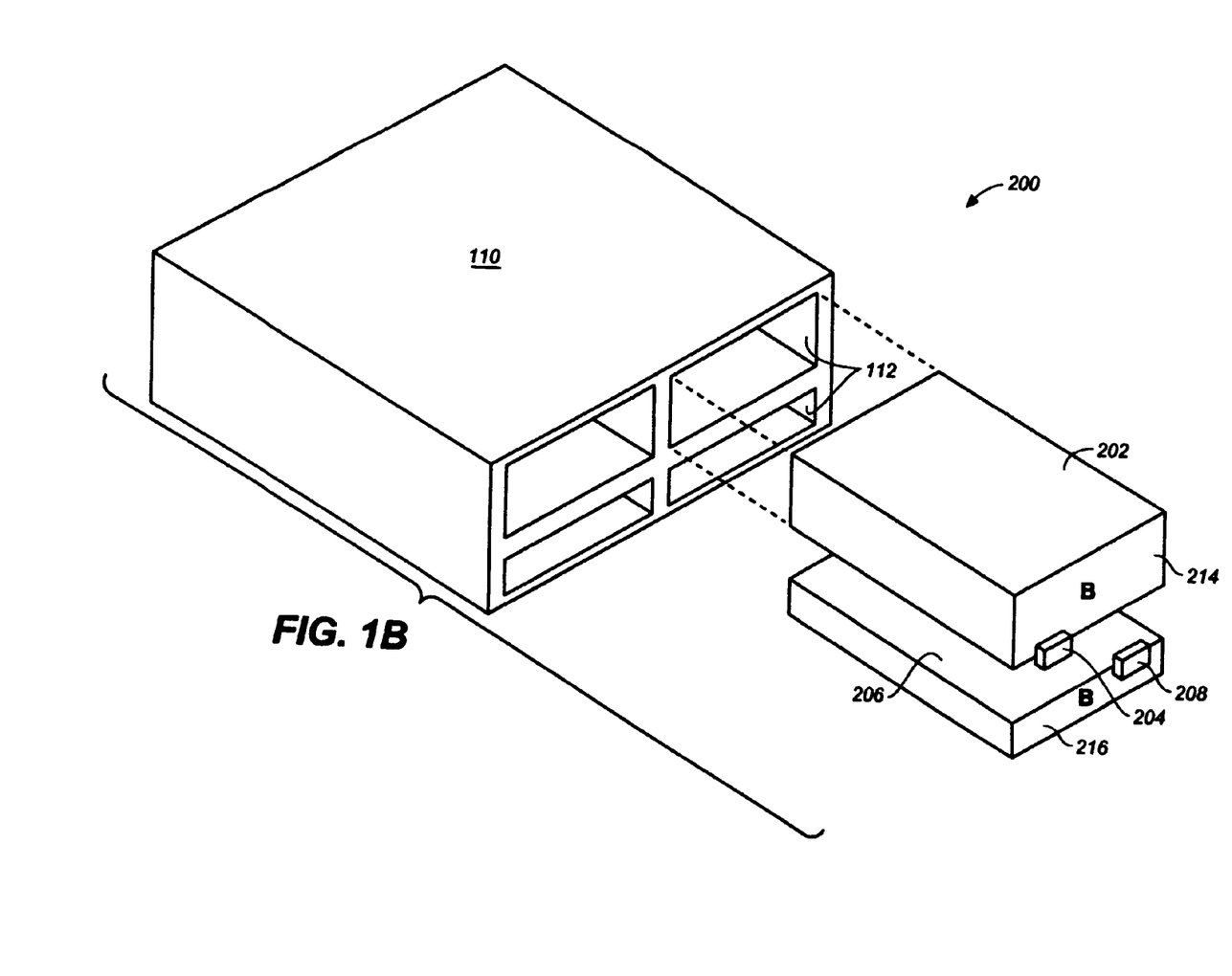
FIG. 1B is a schematic diagram illustrating a system of keying implementation for swapping paired devices in accordance with an additional exemplary embodiment of the present invention, where the system includes a type "B" matched controller/PSU pair.
Figure 1C:
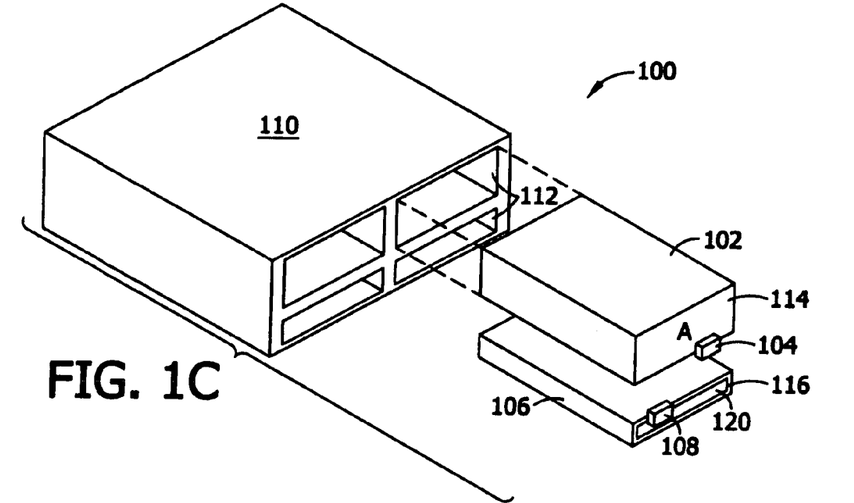
FIG. 1C is a schematic diagram illustrating a system of keying implementation for swapping paired devices in accordance with an alternative embodiment of the present invention, where the system includes a type "A" matched controller/PSU pair.
Figure 1D:
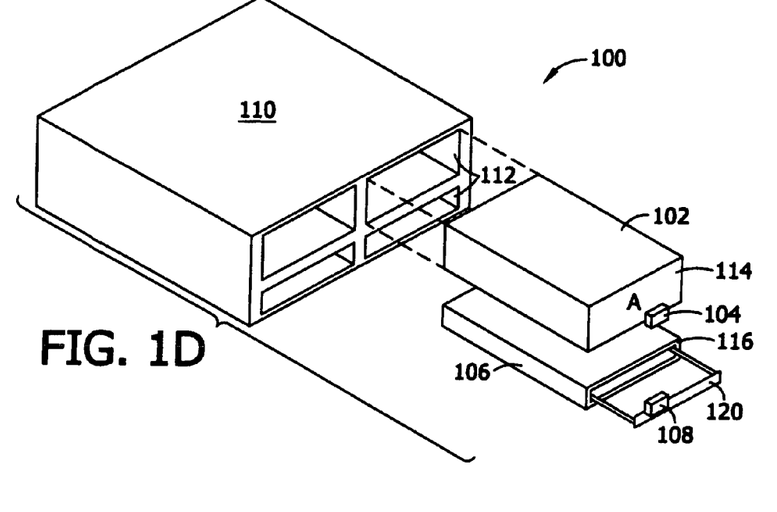
FIG. 1D is a schematic diagram illustrating a system of keying implementation for swapping paired devices in accordance with an exemplary embodiment of the present invention, where the system includes a type "A" matched controller/PSU pair.

FIG. 1B shows a system 200 of keying implementation for swapping paired devices in accordance with an additional exemplary embodiment of the present invention. Similar to the system 100 shown in FIG. 1A, the system 200 includes a type "B" controller module 202 having a first keying member 204, a type "B" PSU 206 having a second keying member 208, and the same chassis 110 having the plurality of receiving slots 112 for receiving the controller module 202 and the PSU 206. The controller module 202 may be a FRU. Preferably, the first keying member 204 is a protrusion on a surface 214 of the controller module 202, and the second keying member 208 is a protrusion on a surface 216 of the PSU 206. Alternatively, the second keying member 208 may be positioned on a handle (not shown) of the PSU 206, where the handle is closed when the PSU 206 supplies power to the controller module 202. When the controller module 202 and the PSU 206 are a matched controller/PSU pair (or pair) such as a high-power pair, a medium-power pair, a low power pair, or the like, the first keying member 204 and the second keying member 208 do not interfere with each other (thus the keying members are matched) when the controller module 202 and the PSU 206 are fully inserted, next to each other, into the plurality of receiving slots 112 so that the PSU 206 may supply power to the controller module 202.

It is evident from FIGS. 1A and 1B that the position of the first keying member 104 of the type "A" controller module 102 (FIG. 1A) is different from the position of the first keying member 204 of the type "B" controller module 202 (FIG. 1B), and the position of the second keying member 108 of the type "A" PSU 106 (FIG. 1A) is different from the position of the second keying member 208 of the type "B" PSU 206 (FIG. 1B). Thus, a mismatched pair of the type "A" controller module 102 and the type "B" PSU 206 may not be fully inserted, next to each other, into the plurality of receiving slots 112 because of interference between the first keying member 104 and the second keying member 208 (not shown), and a mismatched pair of the type "B" controller module 202 and the type "A" PSU 106 may not be fully inserted, next to each other, into the plurality of receiving slots 112 because of interference between the first keying member 204 and the second keying member 108 (not shown). Therefore, the first keying members 104, 204 and the second keying members 108, 208 may prevent a mismatched controller/PSU pair from being installed in the chassis 110.

Figure 2A:
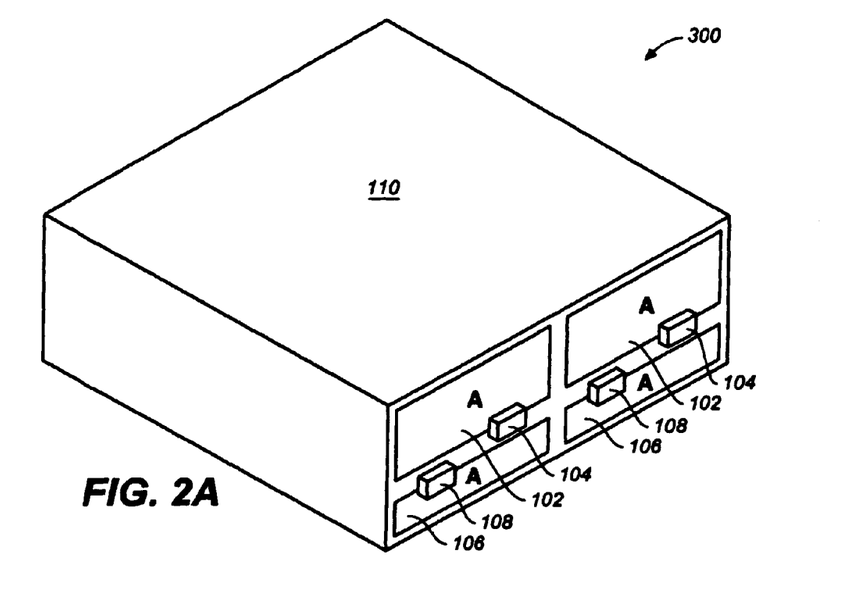
FIG. 2A is a schematic diagram illustrating a system of keying implementation for swapping paired devices in accordance with another exemplary embodiment of the present invention, where the system includes type "A" matched controller/PSU pairs.
Figure 3A:
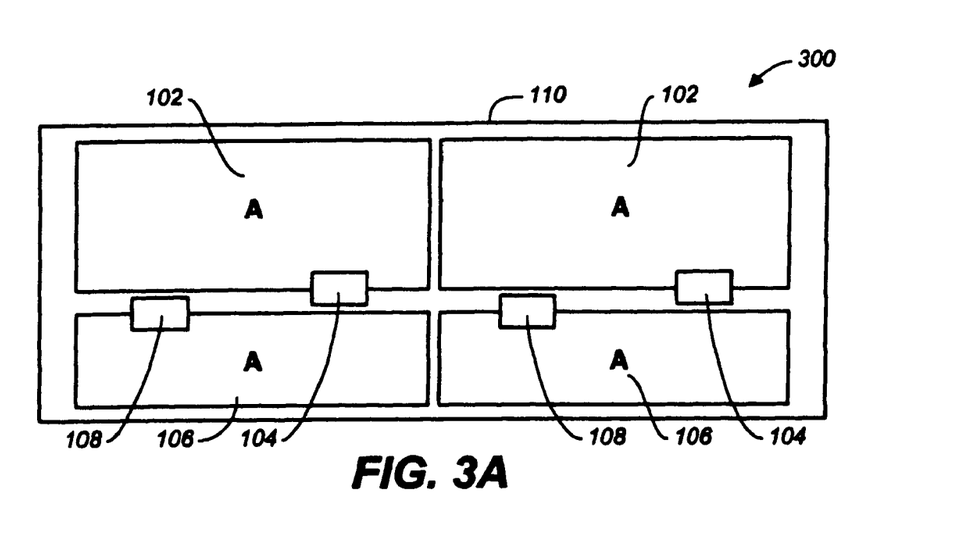
FIG. 3A is a back view of the system of keying implementation for swapping paired devices shown in FIG. 2A.

FIG. 2A shows a system 300 of keying implementation for swapping paired devices in accordance with another exemplary embodiment of the present invention. Similar to the system 100 shown in FIG. 1A, the system 300 includes two type "A" controller modules 102 each with the first keying member 104, two type "A" PSUs 106 each with the second keying member 108, and the same chassis 110 having a plurality of receiving slots for receiving the controller modules 102 and the PSUs 106, where the controller modules 102 and the PSUs 106 are fully inserted into the plurality of receiving slots of the chassis 110. FIG. 3A is a back view of the system 300 shown in FIG. 2A.

Figure 2B:
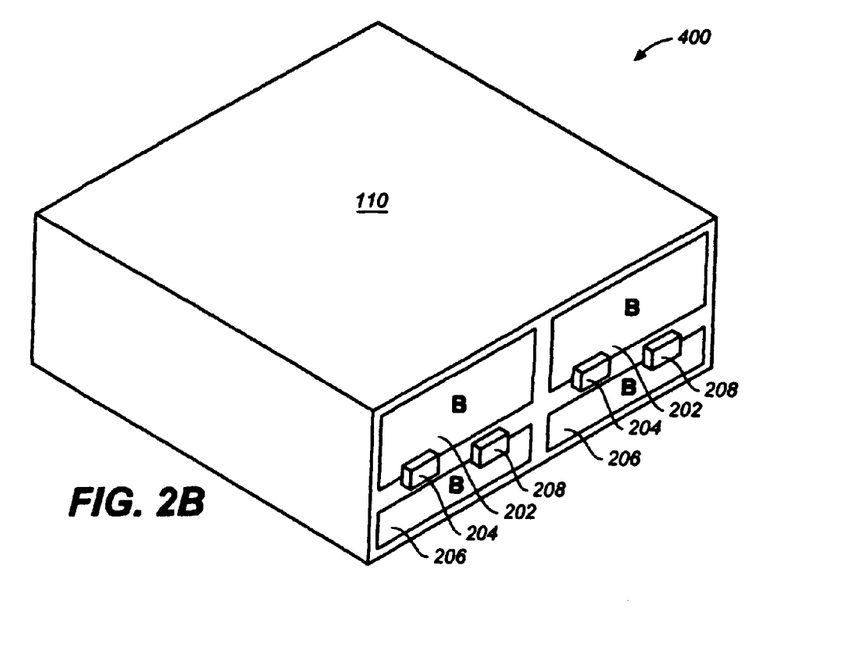
FIG. 2B is a schematic diagram illustrating a system of keying implementation for swapping paired devices in accordance with a further exemplary embodiment of the present invention, where the system includes type "B" matched controller/PSU pairs.
Figure 3B:
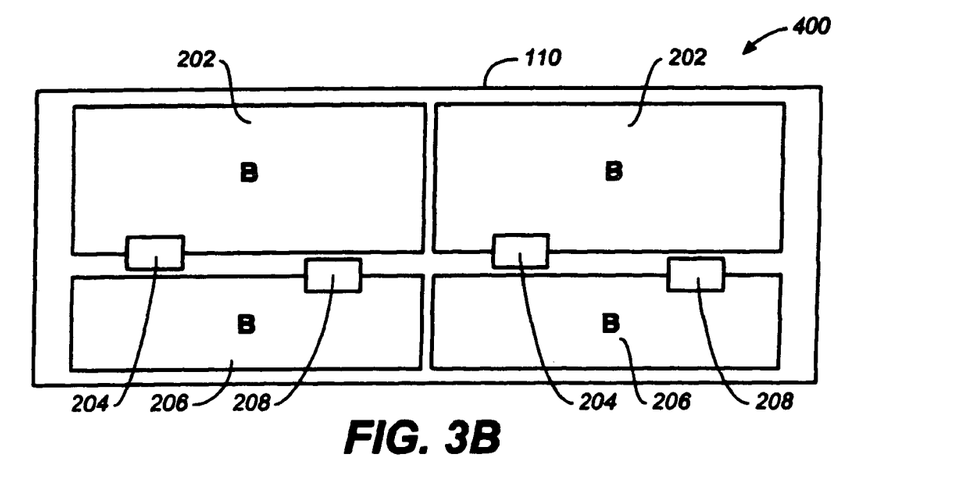
FIG. 3B is a back view of the system of keying implementation for swapping paired devices shown in FIG. 2B.

FIG. 2B shows a system 400 of keying implementation for swapping paired devices in accordance with a further exemplary embodiment of the present invention. Similar to the system 200 shown in FIG. 1B, the system 400 includes two type "B" controller modules 202 each with the first keying member 204, two type "B" PSUs 206 each with the second keying member 208, and the same chassis 110 having a plurality of receiving slots for receiving the controller modules 202 and the PSUs 206, where the controller modules 202 and the PSUs 206 are fully inserted into the plurality of receiving slots of the chassis 110. FIG. 3B is a back view of the system 400 shown in FIG. 2B.

It is understood that although the systems 300 and 400 include two controller/PSU pairs, those of ordinary skill in the art will understand that the systems 300 and 400 may each include any number of controller/PSU pairs and the chassis 110 may include any number of receiving slots without departing from the scope and spirit of the present invention.

In an exemplary embodiment, the present invention provides a method of keying implementation for swapping paired devices. This method may be implemented in each of the systems 100, 200, 300 and 400 shown in FIGS. 1A, 1B, 2A, 2B, 3A and 3B. A controller module including a first keying member is provided. A power supply unit including a second keying member is provided. When the first keying member matches the second keying member, the controller module and the power supply unit are fully inserted, next to each other, into receiving slots of a chassis so that the power supply unit may supply power to the controller module. When the first keying member and the second keying member interfere with each other, the controller module and the power supply unit are prevented from being fully inserted, next to each other, into the receiving slots.

In another exemplary embodiment, the present invention provides a method of keying implementation for swapping paired devices. The method may be implemented in each of the systems 100, 200, 300 and 400 shown in FIGS. 1A, 1B, 2A, 2B, 3A and 3B. At least one controller module and at least one power supply unit are provided. A chassis including receiving slots for receiving the at least one controller module and the at least one power supply unit is provided. A first keying member is installed on one of the at least one controller module. A second keying member is installed on one of the at least one power supply unit. When the one of the at least one controller module and the one of the at least one power supply unit are a matched pair, the one of the at least one controller module and the one of the at least one power supply unit may be fully inserted, next to each other, into the receiving slots so that the one of the at least one power supply unit may supply power to the one of the at least one controller module. When the one of the at least one controller module and the one of the at least one power supply unit are not a matched pair, the first keying member and the second keying member prevent the one of the at least one controller module and the one of the at least one power supply unit from being fully inserted, next to each other, into the receiving slots.

Besides installing matched controller/PSU pairs in a chassis, it may be desirable to have all the installed controller modules be of the same type (i.e., all are high-power modules, medium-power modules, or low-power modules) and all the installed PSUs to be of the same type (i.e., all are high-power PSUs, medium-power PSUs, or low-power PSUs) in the same chassis. Thus, it may be desirable to have a method and system to prevent controller modules and/or PSUs of different types from being installed in the same chassis. However, in the case of the lower-power or medium-power controller module, it may be allowed to have a superset PSU (capable of supplying higher power level than required by the lower-power or medium-power controller module) to supply power to the lower-power or medium-power controller module even though the superset PSU and the lower-power or medium-power controller module are not matched.

Figure 4A:
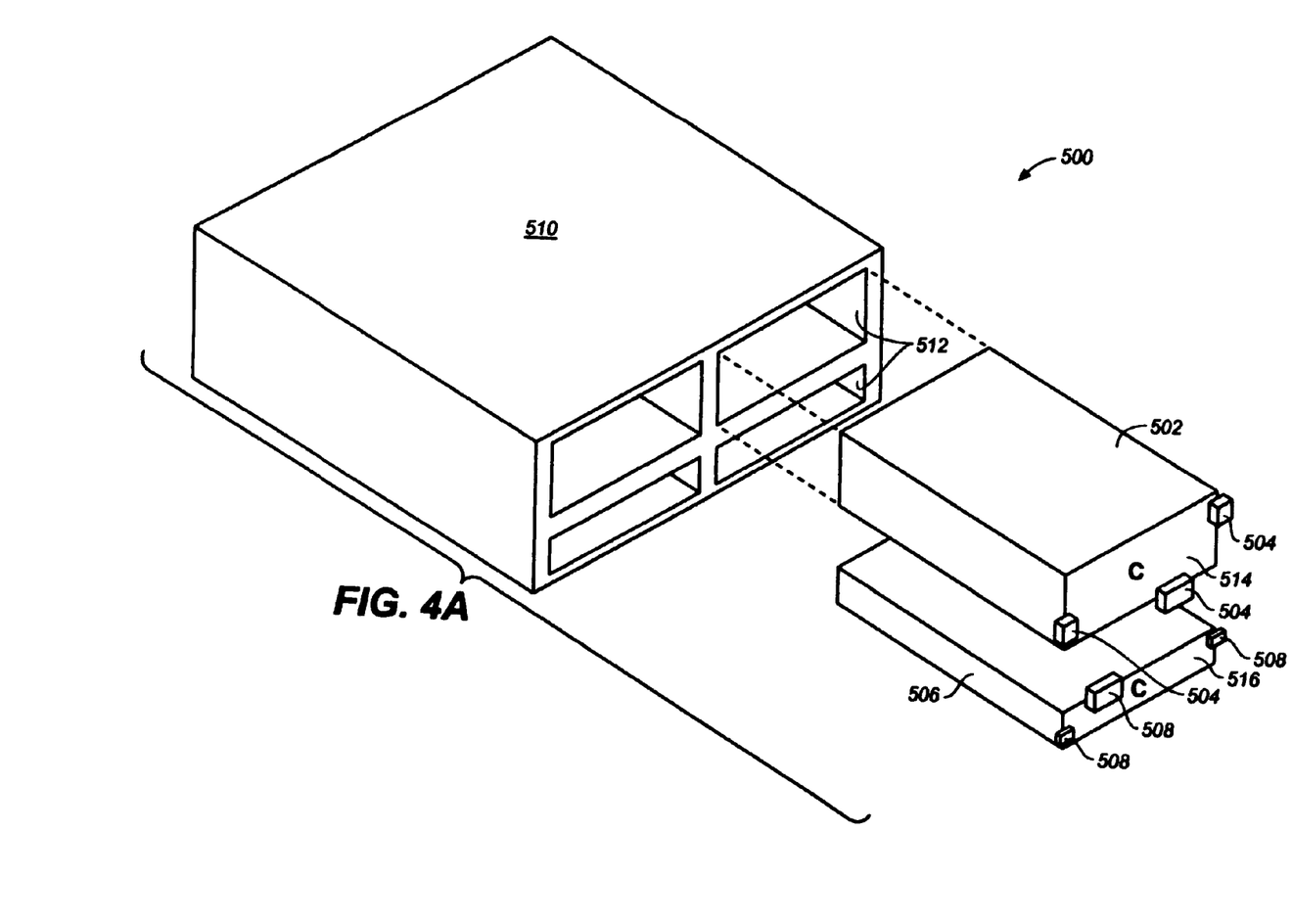
FIG. 4A is a schematic diagram illustrating a system of keying implementation for swapping paired devices in accordance with another exemplary embodiment of the present invention, where the system includes a type "C" matched controller/PSU pair.

Referring now to FIG. 4A, a system 500 of keying implementation for swapping paired devices in accordance with an exemplary embodiment of the present invention is shown. The system 500 includes a type "C" controller module 502 having a plurality of keying members 504, a type "C" PSU 506 having a plurality of keying members 508, and a chassis 510 having a plurality of receiving slots 512 for receiving the controller module 502 and the PSU 506. The controller module 502 may be a field replaceable unit (FRU). A FRU is a hardware component that can be replaced in the field upon failure. Preferably, the plurality of keying members 504 are protrusions on the surface 514 of the controller module 502, and the plurality of keying members 508 are protrusions on the surface 516 of the PSU 506. Alternatively, the plurality of keying members 508 may be positioned on a handle (not shown) of the PSU 506, where the handle is closed when the PSU 506 supplies power to the controller module 502. When the controller module 502 and the PSU 506 are a matched controller/PSU pair (or pair) such as a high-power pair, a medium-power pair, a low power pair, or the like, the plurality of keying members 504 and the plurality of keying members 508 do not interfere with each other (thus the keying members are matched) when the controller module 502 and the PSU 506 are fully inserted, next to each other, into the plurality of receiving slots 512 so that the PSU 506 may supply power to the controller module 502. In addition, when the controller module 502 and the PSU 506 are a matched pair, the matched pair may be color coded in the same color to help with easy identification.

Figure 4B:
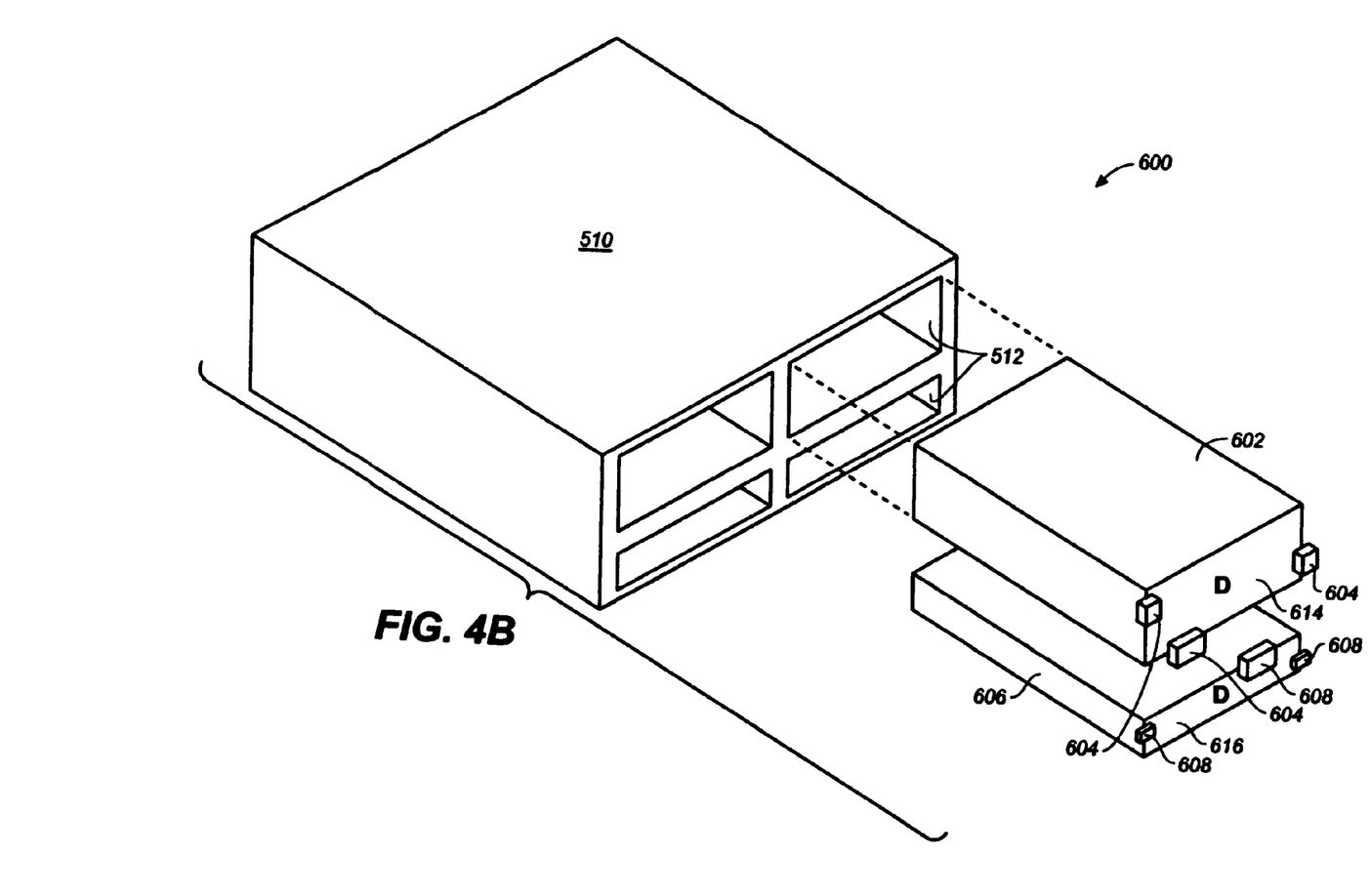
FIG. 4B is a schematic diagram illustrating a system of keying implementation for swapping paired devices in accordance with a further exemplary embodiment of the present invention, where the system includes a type "D" matched controller/PSU pair.

FIG. 4B shows a system 600 of keying implementation for swapping paired devices in accordance with an exemplary embodiment of the present invention. The system 600 includes a type "D" controller module 602 having a plurality of keying members 604, a type "D" PSU 606 having a plurality of keying members 608, and a chassis 510 having a plurality of receiving slots 512 for receiving the controller module 602 and the PSU 606. The controller module 602 may be a field replaceable unit (FRU). A FRU is a hardware component that can be replaced in the field upon failure. Preferably, the plurality of keying member 604 are protrusions on the surface 614 of the controller module 602, and the plurality of keying members 608 are protrusions on the surface 616 of the PSU 606. Alternatively, the plurality of keying members 608 may be positioned on a handle (not shown) of the PSU 606, where the handle is closed when the PSU 606 supplies power to the controller module 602. When the controller module 602 and the PSU 606 are a matched controller/PSU pair (or pair) such as a high-power pair, a medium-power pair, a low power pair, or the like, the plurality of keying members 604 and the plurality of keying members 608 do not interfere with each other (thus the keying members are matched) when the controller module 602 and the PSU 606 are fully inserted, next to each other, into the plurality of receiving slots 512 so that the PSU 606 may supply power to the controller module 602. In addition, when the controller module 602 and the PSU 606 are a matched pair, the matched pair may be color coded in the same color to help with easy identification.

It is evident from FIGS. 4A and 4B that the positions of the plurality of keying members 504 of the type "C" controller module 502 (FIG. 4A) are different from the positions of the plurality of keying members 604 of the type "D" controller module 602 (FIG. 4B). The module 502 and the module 602 may be of a different type (e.g., the module 502 is a high-power module, and the module 602 is a lower-power module). The plurality of keying members 504 and 604 may prevent different types of controller modules 502 and 602 from being installed, next to each other, in the chassis 510.

It is also evident that the positions of the plurality of keying members 508 of the type "C" PSU 506 (FIG. 4A) are different from the positions of the plurality of keying members 608 of the type "B" PSU 606 (FIG. 4B). The PSU 506 and the PSU 606 may be of a different type (e.g., the PSU 506 is a high-power PSU, and the PSU 606 is a lower-power PSU). The plurality of keying members 508 and 608 may prevent different types of PSUs 506 and 606 from being installed, next to each other, in the chassis 510.

Thus, a mismatched pair of the type "C" controller module 502 and the type "D" PSU 606 may not be fully inserted, next to each other, into the plurality of receiving slots 512 because of interference between the plurality of keying members 504 and the plurality of keying members 608 (not shown), and a mismatched pair of the type "D" controller module 602 and the type "C" PSU 506 may not be fully inserted, next to each other, into the plurality of receiving slots 512 because of interference between the plurality of keying members 604 and the plurality of keying members 508 (not shown). Therefore, the first keying members 104, 204 and the second keying members 108, 208 may prevent a mismatched controller/PSU pair from being installed, next to each other, in the chassis 110.

Figure 5A:
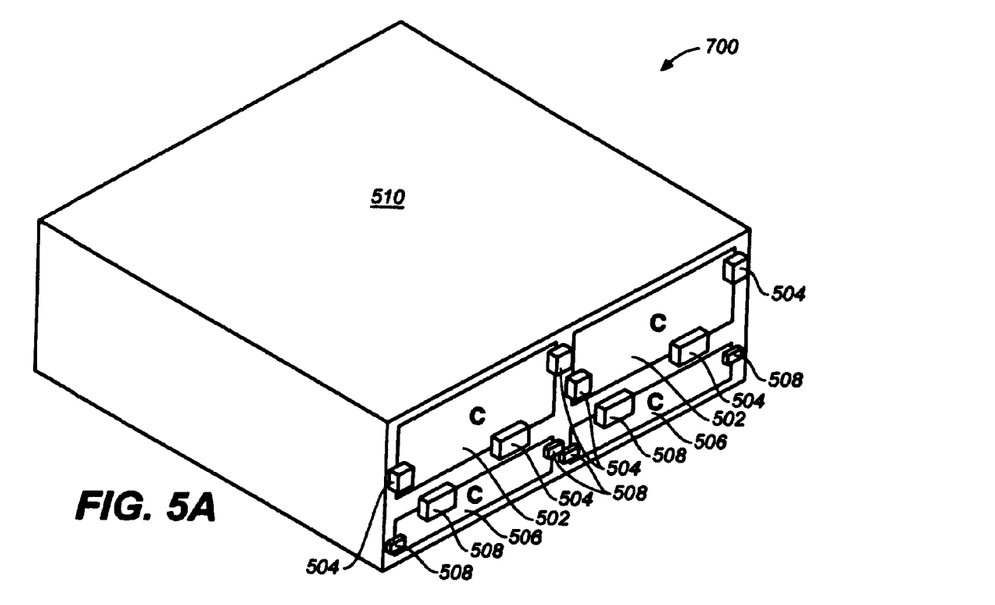
FIG. 5A is a schematic diagram illustrating a system of keying implementation for swapping paired devices in accordance with still a further exemplary embodiment of the present invention, where the system includes type "C" matched controller/PSU pairs.
Figure 6A:
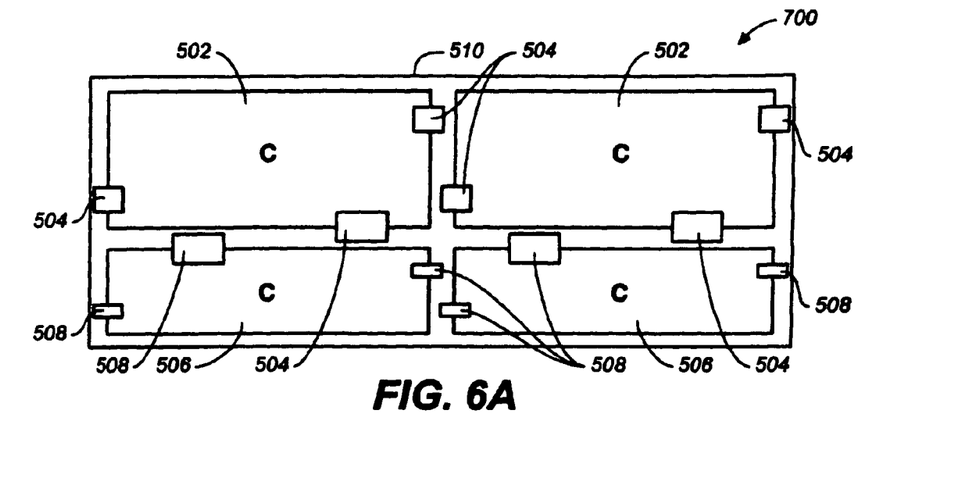
FIG. 6A is a back view of the system of keying implementation for swapping paired devices shown in FIG. 5A.

FIG. 5A shows a system 700 of keying implementation for swapping paired devices in accordance with another exemplary embodiment of the present invention. Similar to the system 500 shown in FIG. 4A, the system 700 includes two type "C" controller modules 502 (placed next to each other) each with the plurality of keying members 504, two type "C" PSUs 506 (placed next to each other) each with the plurality of keying members 508, and the same chassis 510 having a plurality of receiving slots for receiving the controller modules 502 and the PSUs 506, where the controller modules 502 and the PSUs 506 are fully inserted into the plurality of receiving slots of the chassis 510. FIG. 6A is a back view of the system 700 shown in FIG. 5A.

Figure 5B:
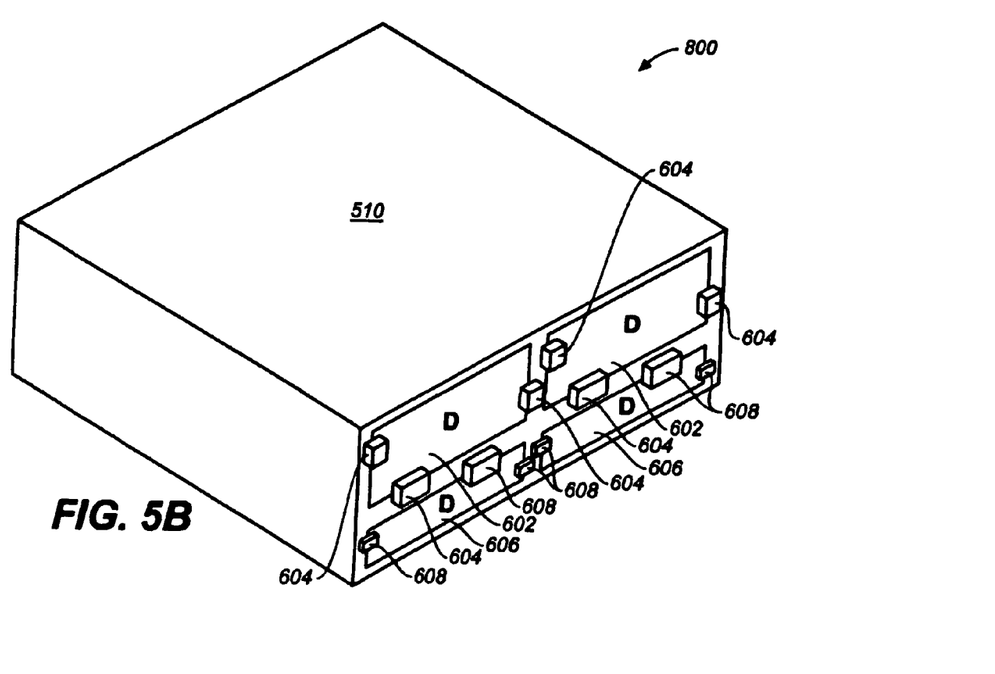
FIG. 5B is a schematic diagram illustrating a system of keying implementation for swapping paired devices in accordance with another exemplary embodiment of the present invention, where the system includes type "D" matched controller/PSU pairs.
Figure 6B:
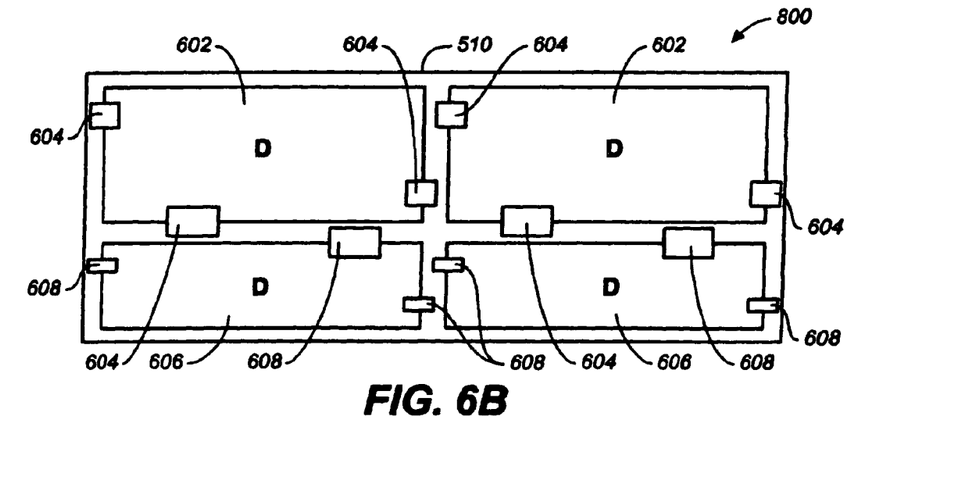
FIG. 6B is a back view of the system of keying implementation for swapping paired devices shown in FIG. 5B.

FIG. 5B shows a system 800 of keying implementation for swapping paired devices in accordance with another exemplary embodiment of the present invention. Similar to the system 600 shown in FIG. 4B, the system 800 includes two type "D" controller modules 602 (placed next to each other) each with the plurality of keying members 604, two type "D" PSUs 506 (placed next to each other) each with the plurality of keying members 608, and the same chassis 510 having a plurality of receiving slots for receiving the controller modules 602 and the PSUs 606, where the controller modules 602 and the PSUs 606 are fully inserted into the plurality of receiving slots of the chassis 510. FIG. 6B is a back view of the system 800 shown in FIG. 5B.

It is understood that although the systems 700 and 800 include two controller/PSU pairs, those of ordinary skill in the art will understand that the systems 700 and 800 may each include any number of controller/PSU pairs and the chassis 510 may include any number of receiving slots without departing from the scope and spirit of the present invention.

In an exemplary embodiment, the present invention provides a method of keying implementation for swapping paired devices. This method may be implemented in any of the systems 500, 600, 700 and 800 shown in FIGS. 4A, 4B, 5A, 5B, 6A and 6B. A first controller module including a first plurality of keying members, a second controller module including a second plurality of keying members, a first power supply unit including a third plurality of keying members, and a second power supply unit including a fourth plurality of keying members are provided. A chassis including receiving slots for receiving the first controller module, the second controller module, the first power supply unit, and the second power supply unit are provided. When the first controller module and the first power supply unit are a matched pair, the first controller module and the first power supply unit may be fully inserted, next to each other, into the receiving slots so that the first power supply unit may supply power to the first controller module. When the first controller module and the first power supply unit are not matched, the first plurality of keying members and the third plurality of keying members prevent the first controller module and the first power supply unit from being fully inserted, next to each other, into the receiving slots. When the first controller module and the first power supply unit are not matched, the first plurality of keying members and the third plurality of keying members prevent the first controller module and the first power supply unit from being fully inserted, next to each other, into the receiving slots. When the first controller module and the second controller module are of the same type, the first controller module and the second controller module may be fully inserted, next to each other, into the receiving slots. When the first controller module and the second controller module are not of the same type, the first plurality of keying members and the second plurality of keying members prevent the first controller module and the second controller module from being fully inserted, next to each other, into the receiving slots. When the first power supply unit and the second power supply unit are of the same type, the first power supply unit and the second power supply unit may be fully inserted, next to each other, into the receiving slots. When the first power supply unit and the second power supply unit are not of the same type, the third plurality of keying members and the fourth plurality of keying members prevent the first power supply unit and the second power supply unit from being fully inserted, next to each other, into the receiving slots.

Figure 7:
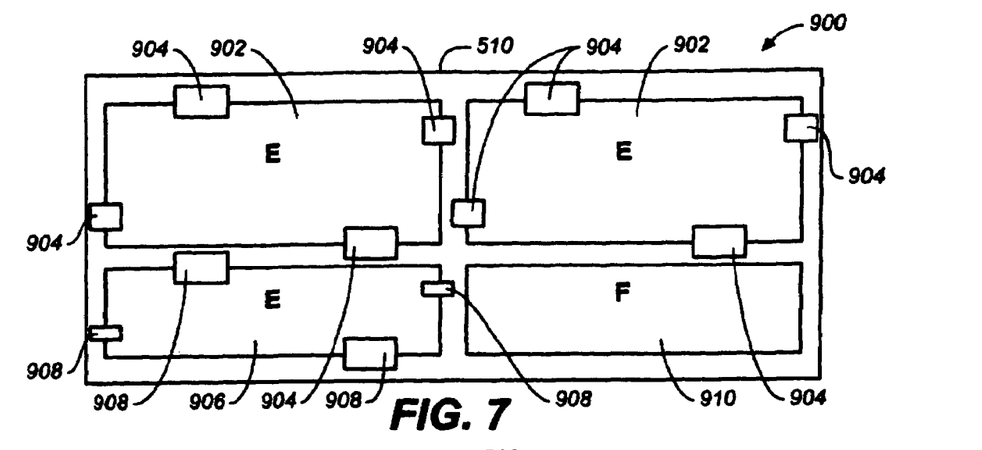
FIG. 7 is a back view of a system of keying implementation for swapping paired devices in accordance with another exemplary embodiment of the present invention, where the system includes a superset power supply module "F" and a type "E" matched controller/PSU pair.

FIG. 7 is a schematic diagram illustrating a system 900 of keying implementation for swapping paired devices in accordance with another exemplary embodiment of the present invention. The system 900 includes a superset type "F" PSU 910, two type "E" controller modules 902, one type "E" PSU 906, and a chassis 510 having a plurality of receiving slots. Preferably, the PSU 910 includes no keying member at all. The controller modules 902 include a plurality of keying members 904, and the PSU 906 includes a plurality of keying members. Preferably, the plurality of keying member 904 are protrusions on the surface of the controller modules 902, and the plurality of keying members 908 are protrusions on the surface of the PSU 906. As shown, the two controller modules 902 are fully inserted, next to each other, into the receiving slots of the chassis 510. The PSU 906 is fully inserted, next to one of the controller modules 902, into the receiving slots of the chassis 510 so that the PSU 906 may supply power to the one of the controller modules 902 (they are a matched type "E" pair). Since the PSU 910 may have no keying members, the PSU 910 may be fully inserted, next to the other controller module 902, into the receiving slots of the chassis 510. Thus, even though the type "F" PSU 910 and the type "E" controller module 902 are not a matched pair (e.g., the PSU 910 may be a high-power PSU, and the controller module 902 may be a lower-power controller module), they may still be fully inserted, next to each other, into the receiving slots of the chassis 510 so that the PSU 910, as a superset PSU, may supply power to the controller module 902.

Figure 8A:
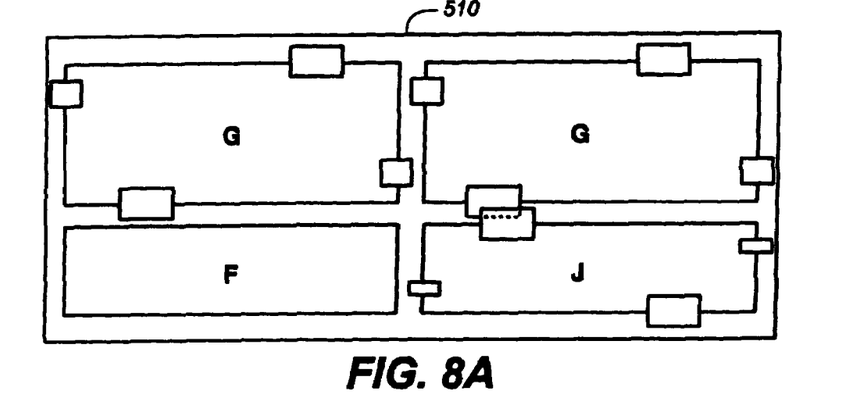
FIGS. 8A and 8B illustrate a mismatched controller/PSU pair and a superset power supply module may not co-exist in a system of keying implementation for swapping paired devices in accordance with another exemplary embodiment of the present invention.
Figure 8B:
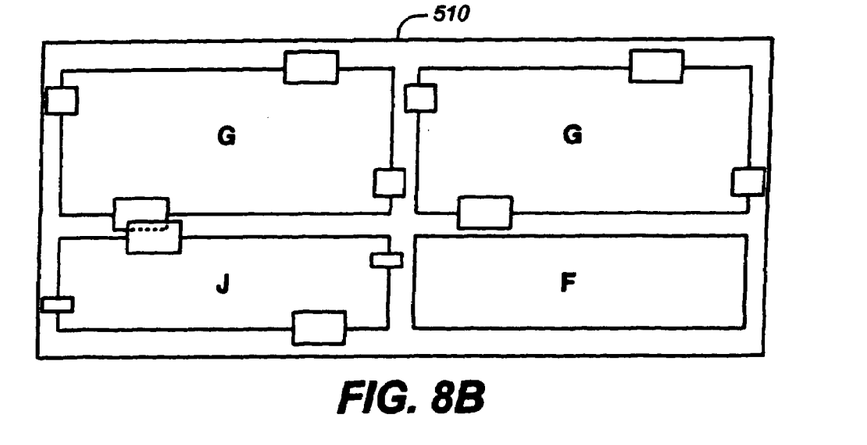

Thus, the system 900 may include a matched pair of the controller module 902 and the PSU 906, and a mismatched pair of the controller module 902 and the superset PSU 910. In an exemplary embodiment, when a system of keying implementation for swapping paired devices includes a mismatched pair of a controller module and a superset PSU, the system may not include another mismatched pair of a controller module and a PSU which is not a superset PSU. This is shown in FIGS. 8A and 8B, where the system includes a mismatched pair of a type "G" controller module and a superset type "F" PSU, another mismatched pair of a type "G" controller module and a type "J" PSU which is not a superset PSU may not be included in the system, since keying members of the mismatched pair of the type "G" controller module and the type "J" PSU interfere with each other (see FIGS. 8A and 8B) so that the mismatched pair of the type "G" controller module and the type "J" PSU may not be fully inserted, next to each other, into receiving slots of the chassis 510.

In an exemplary embodiment, the present invention provides a method of keying implementation for swapping paired devices. This method may be implemented in the system 900 shown in FIG. 7. A first controller module including a first plurality of keying members and a second controller module including a second plurality of keying members are fully inserted, next to each other, into receiving slots of a chassis, where the first plurality of keying members and the second plurality of keying members do not interfere with each other. The first controller module and the second controller module are of a same type. A first power supply unit including a third plurality of keying members is fully inserted, next to the first controller module, into the receiving slots so that the first power supply unit may supply power to the first controller module, where the first power supply unit and the first controller module is a matched pair, and the first plurality of keying members and the third plurality of keying members do not interfere with each other. A second power supply unit is fully inserted, next to the second controller module and the first power supply unit, into the receiving slots so that the second power supply unit may supply power to the second controller module. The second power supply unit (e.g., a superset PSU) is capable of providing a power level not lower than a power level required by the second controller module. Preferably, the second power supply unit does not have a keying member.

The present invention may have the following advantages. First, it may prevent one, whether skilled in the art or not, from incorrectly configuring and/or damaging a device. In addition, the present invention may increase uptime of the device because of easy identification of correct FRUs and reduced service time. Moreover, the present invention may enable the same chassis to be used for a filer (a filer is a network attached storage device from Network Appliance, Inc.) or JBOD (Just A Bunch Of Disks). With the common chassis, the present invention may save cost of parts and provide options for multiple configurations for FRUs.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method of keying implementation for swapping paired devices, comprising:
   providing a controller module including a first keying member;
   providing a power supply unit including a second keying member;
   fully inserting said controller module and said power supply unit, next to each other, into receiving slots of a chassis so that said power supply unit may supply power to said controller module when said first keying member matches said second keying member; and
   preventing said controller module and said power supply unit from being fully inserted, next to each other, into said receiving slots when said first keying member and said second keying member interfere with each other,
   wherein when said first keying member matches said second keying member, a power requirement of said controller module substantially matches a power production capability of said power supply unit.

2. The method of claim 1, wherein said controller module is a field replaceable unit.

3. The method of claim 1, further comprises color coding said controller module and said power supply unit with same color when said first keying member matches said second keying member.

4. The method of claim 1, wherein said second keying member is positioned on a handle of said power supply unit.

5. The method of claim 4, wherein said handle is closed when said power supply unit supplies power to said controller module.

6. The method of claim 1, wherein said first keying member is a protrusion on a surface of said controller module.

7. The method of claim 1, wherein when said first keying member and said second keying member interfere with each other, a power requirement of said controller module is substantially different from a power production capability of said power supply unit.

* * * * *